US006333266B1

United States Patent
Sugiyama

(10) Patent No.: US 6,333,266 B1
(45) Date of Patent: Dec. 25, 2001

(54) MANUFACTURING PROCESS FOR A SEMICONDUCTOR DEVICE

(75) Inventor: Satoru Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/264,567

(22) Filed: Mar. 8, 1999

(30) Foreign Application Priority Data

Mar. 12, 1998 (JP) .................................................. 10-061419

(51) Int. Cl.$^7$ .................................................. H01L 21/44
(52) U.S. Cl. .................. 438/684; 438/905; 438/913; 438/958; 118/900
(58) Field of Search .................. 118/900; 438/684, 438/902, 905, 913, 920, 958; 427/255.27, 255.28, 255.29

(56) References Cited

U.S. PATENT DOCUMENTS

| | | | |
|---|---|---|---|
| 3,919,060 | 11/1975 | Pogge et al. | 204/129.3 |
| 4,441,249 | 4/1984 | Alspector et al. | 29/577 |
| 5,021,354 | 6/1991 | Pfiester | 437/34 |
| 5,320,680 | 6/1994 | Learn et al. | 118/724 |
| 5,503,875 | 4/1996 | Imai et al. | 427/255.3 |
| 5,554,226 | 9/1996 | Okase et al. | 118/724 |
| 5,589,233 | * 12/1996 | Law et al. | 427/579 |
| 5,780,342 | 7/1998 | Wang | 438/260 |
| 5,783,257 | 7/1998 | Shishiguchi et al. | 427/255.2 |
| 6,129,950 | * 8/1998 | Chen et al. | 427/255.18 |

FOREIGN PATENT DOCUMENTS

| | | |
|---|---|---|
| 0 051 534 | 5/1982 | (EP) . |
| 0 109 766 | 5/1984 | (EP) . |
| 59-127841 | 7/1984 | (JP) . |
| 3-236471 | 10/1991 | (JP) . |
| 8-8195 | 1/1996 | (JP) . |
| 8-250507 | 9/1996 | (JP) . |
| 9-53179 | 2/1997 | (JP) . |
| 9-275099 | 10/1997 | (JP) . |
| 10-242064 | 9/1998 | (JP) . |

OTHER PUBLICATIONS

Machine assisted translation of JP 10–242064–A.*
WPI Accession No. 98–548278 & JP 10242064 A (Hitachi) 11; Sep. 1998.

* cited by examiner

Primary Examiner—Carl Whitehead, Jr.
Assistant Examiner—Jeff Vockrodt
(74) Attorney, Agent, or Firm—Foley & Lardner

(57) ABSTRACT

This invention relates to a manufacturing process for a semiconductor device, comprising injecting a silane compound and a dopant into a low-pressure chemical vapor deposition reactor to deposit a doped silicon film on a wafer; and at the end of the deposition, injecting an oxidizing gas to form an oxide film over the silicon film deposited in the reactor. According to this invention, anomalous growth or generation of foreign matters such as particles during a deposition step can be effectively minimized to improve a production yield and provide a high-quality and highly reliable semiconductor device.

12 Claims, 6 Drawing Sheets

(a)     (b)

MANUFACTURING PROCESS FOR A SEMICONDUCTOR DEVICE

BACKGROUND OF THE INVENTION

1. Field of the Invention

This invention relates to a manufacturing process for a semiconductor device and a low-pressure chemical vapor deposition reactor utilizing the process.

2. Description of the Related Art

As a semiconductor device has been increasingly integrated, a two-dimensional design rule such as a circuit pattern has recently become finer and smaller. In particular, a two-dimensional area in wiring has been reduced to increase of a wire resistance, while a semiconductor device has come to be of higher speed so that needed operating characteristics for the device requires keeping the wire resistance equal to or lower than that before size reduction.

To solve the problem in a wire resistance, a variety of materials for a wire have been investigated and practically used. Conventionally, an electrode such as a gate electrode for a general CMOS semiconductor device and a capacity-section electrode for a DRAM (random access memory) has been formed by diffusing phosphorus, in a high-temperature diffusion furnace, on polycrystal silicon film (Poly-Si film) deposited using a low-pressure chemical vapor deposition method (LPCVD method) to diffuse a dopant into the film for reducing an electrical resistance. The phosphorus diffusion method diffuses a dopant in a film surface. It has been, therefore, difficult to diffuse the dopant completely from the surface to a bottom of a minute via. In addition, for a low concentration of dopant, a dopant level cannot be well controlled to be even in the depth direction of the Poly-Si film.

Recently a phosphorus-doped silicon film has been predominantly produced, which is formed adding a phosphorus compound gas as a dopant to a deposition gas in situ. In the phosphorus-doped film deposition process, the dopant is injected during deposition in the LPCVD method, which may solve the problem in the conventional phosphorus diffusion method. In addition, the deposited film may be activated by heating to achieve a much lower electrical resistance than that by a conventional phosphorus diffusion method. Thus, a phosphorus-doped silicon film formation is an essential process for manufacturing a recent advanced semiconductor device.

In general, a phosphorus-doped silicon film is deposited on one or more wafers by injecting $SiH_4$ and $PH_3$ gases into a CVD reactor at 500 to 600° C. in which the wafers are placed. During the process, in a region more distant from an injector for the deposition gas, the gas is more consumed and $PH_3$ gas originally in a less amount than $SiH_4$ gas is more deficient, which may cause the proportion of $PH_3$ gas in the deposition gas (partial pressure) to be reduced or uneven. Thus, it may lead to a problem that a phosphorus level in the film varies depending on the place of the wafer in the reactor. Therefore, in addition to a main injector, one or more $PH_3$ injectors are generally provided in a reactor to make the phosphorus level even all over the reactor.

Such a CVD reactor, however, has the following problem. In a conventional process, at the end of a deposition process, all deposition gas injections are immediately stopped by setting a flow rate of each mass flow controller for the deposition gas to zero. A $SiH_4/PH_3$ supply line for a main injector will stop its deposition gas supply with substantially no delay because of its large flow rate. In contrast, a supply line for a $PH_3$ injector, where the flow rate is low, is long and difficult to be well-controlled in its flow rate. It may, therefore, take a time to completely discharge the remaining $PH_3$ in the line or the mass flow controller, leading to flowing of the $PH_3$ into the reactor. That is, while supply of $SiH_4$ from the main injector is stopped, a small amount of $PH_3$ from the additional $PH_3$ injectors is continuously supplied into the reactor.

Due to lack of $SiH_4$ supply, the unreacted $PH_3$ which has flown into the reactor in such a manner adheres to the surfaces of the phosphorus-doped silicon films on the wafers, without being incorporated into the films, and a dummy wafer as well as on the inner wall of the reactor (FIG. 5(a)). At the end of the deposition process, the reactor is opened in the atmosphere for a next batch of deposition. If the reactor is opened in the presence of unreacted $PH_3$ on the surfaces, the adhered $PH_3$ may react with moisture in the air to produce phosphorus compounds such as phosphoric acid and $P_2O_5$ (FIG. 5(b)). Since these phosphorus compounds are sublimable, they may be diffused out during the next batch of deposition in the reactor to adhere to surfaces of unprocessed wafers.

In deposition of a phosphorus-doped silicon film, if there is a surface region of an unprocessed substrate to which phosphorus compounds such as phosphorus oxides adhere, i.e., a region having a locally high level of phosphorus, the region tends to cause crystallization. Basically, phosphorus-doped silicon is deposited through growing of amorphous silicon. The growth rate is, therefore, very slow, i.e., 20 to 30 Å/min (ca.530° C.), while in the region where crystallization has occurred the growth rate may be about twice. Thus, at the end of deposition, it may cause various problems such as anomalous growth and foreign materials including particles. FIG. 6 schematically shows an example of film formation generating a foreign matter, in which 61 is an Si substrate, 62 is an interlayer insulating film, 63 is a phosphorus-doped silicon film, 64 is a phosphorus compound and 65 is a foreign matter. When a stand-by time in the atmosphere until a next batch (waiting time for a reactor) is long, the unreacted $PH_3$ may react with moisture sufficiently to sharply increase the number of foreign matters depending on the stand-by time. FIG. 4 is a graph showing the average number of foreign matters in relation to a stand-by time under the deposition conditions described later. Generation of such foreign matters may prominently reduce a production yield and an operating ratio due to necessity of washing the reactor, as well as may deteriorate properties and reliability of a product.

SUMMARY OF THE INVENTION

An objective of this invention is to provide a manufacturing process for a semiconductor device, which can minimize anomalous growth or formation of foreign matters such as particles and improve a production yield and an operating ratio to provide a high-quality and highly reliable semiconductor device, as well as a low-pressure chemical vapor deposition reactor for manufacturing such a semiconductor device.

This invention provides a manufacturing process for a semiconductor device, comprising injecting a silane compound and a dopant into a low-pressure chemical vapor deposition reactor to deposit a doped silicon film on a wafer; and at the end of the deposition, injecting an oxidizing gas to form an oxide film over the silicon film deposited in the reactor.

This invention also provides a manufacturing process for a semiconductor device comprising injecting a silane compound and a dopant into a low-pressure chemical vapor deposition reactor to deposit a doped silicon film on a wafer, comprising injecting an oxidizing gas before placing a wafer to form an oxide film over the silicon film deposited in the reactor in the previous batch.

This invention also provide a low-pressure chemical vapor deposition reactor comprising an external heater, a reaction tube provided with an exhaust means, injectors for injecting a silane compound and a dopant into the reaction tube, a mechanism for injecting an oxidizing gas from at least one of the injectors, a holding means for placing a wafer in the reaction tube and a mechanism for removing the holding means from the reaction tube.

According to this invention, anomalous growth or generation of foreign matters such as particles during a deposition step can be effectively minimized to improve a production yield and provide a high-quality and highly reliable semiconductor device.

This invention can eliminate a step of washing phosphorus compounds derived from a dopant such as $PH_3$ adhering to the inner surface of the reactor, which has been required in a conventional process, to improve an operating ratio of the reactor.

DETAILED DESCRIPTION OF THE PREFERRED EMBODIMENTS

Some embodiments of this invention will be described in detail.

Figure 1:
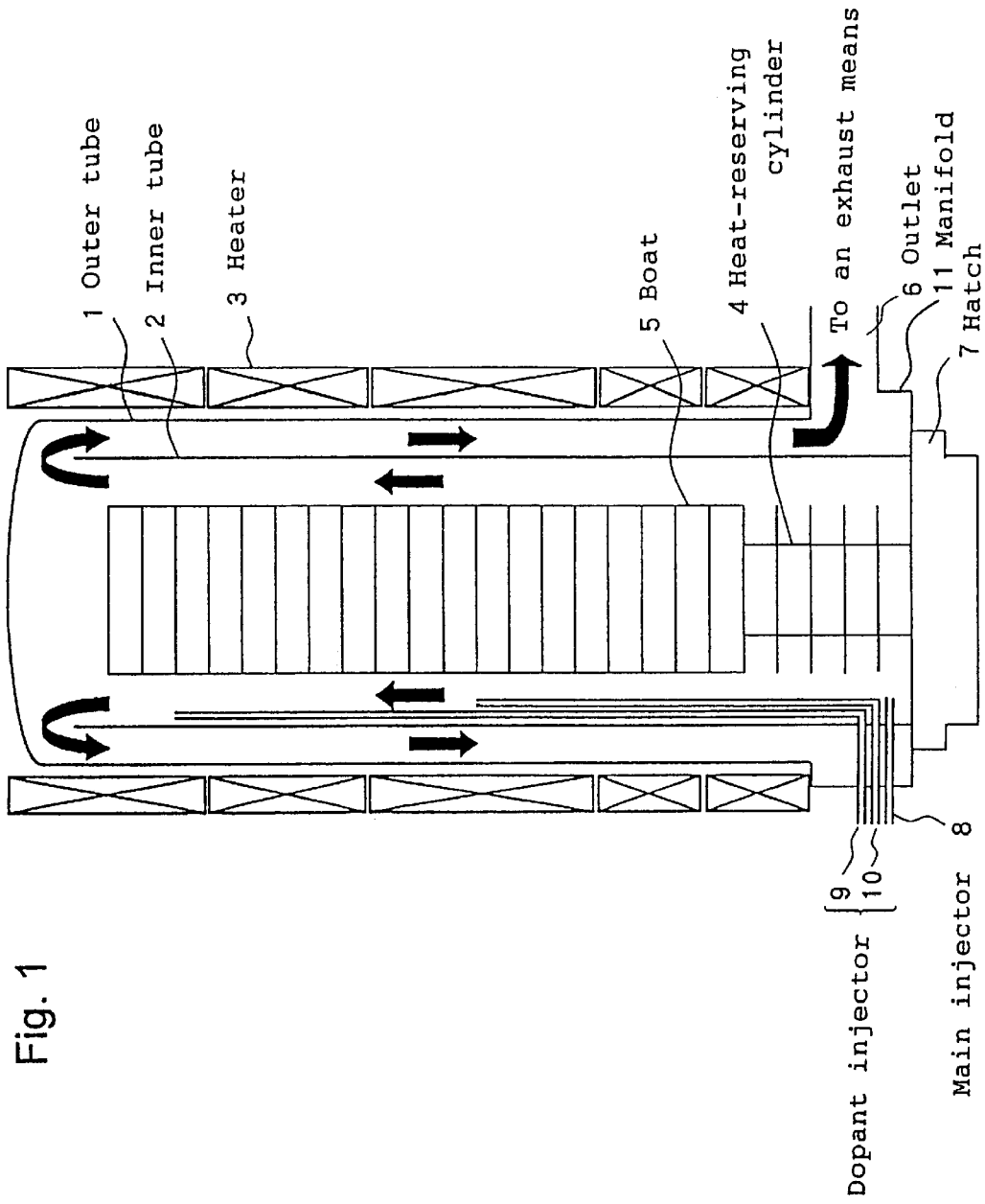
FIG. 1 shows a schematic configuration of an embodiment of a low-pressure chemical vapor deposition reactor according to this invention.
Figure 2:
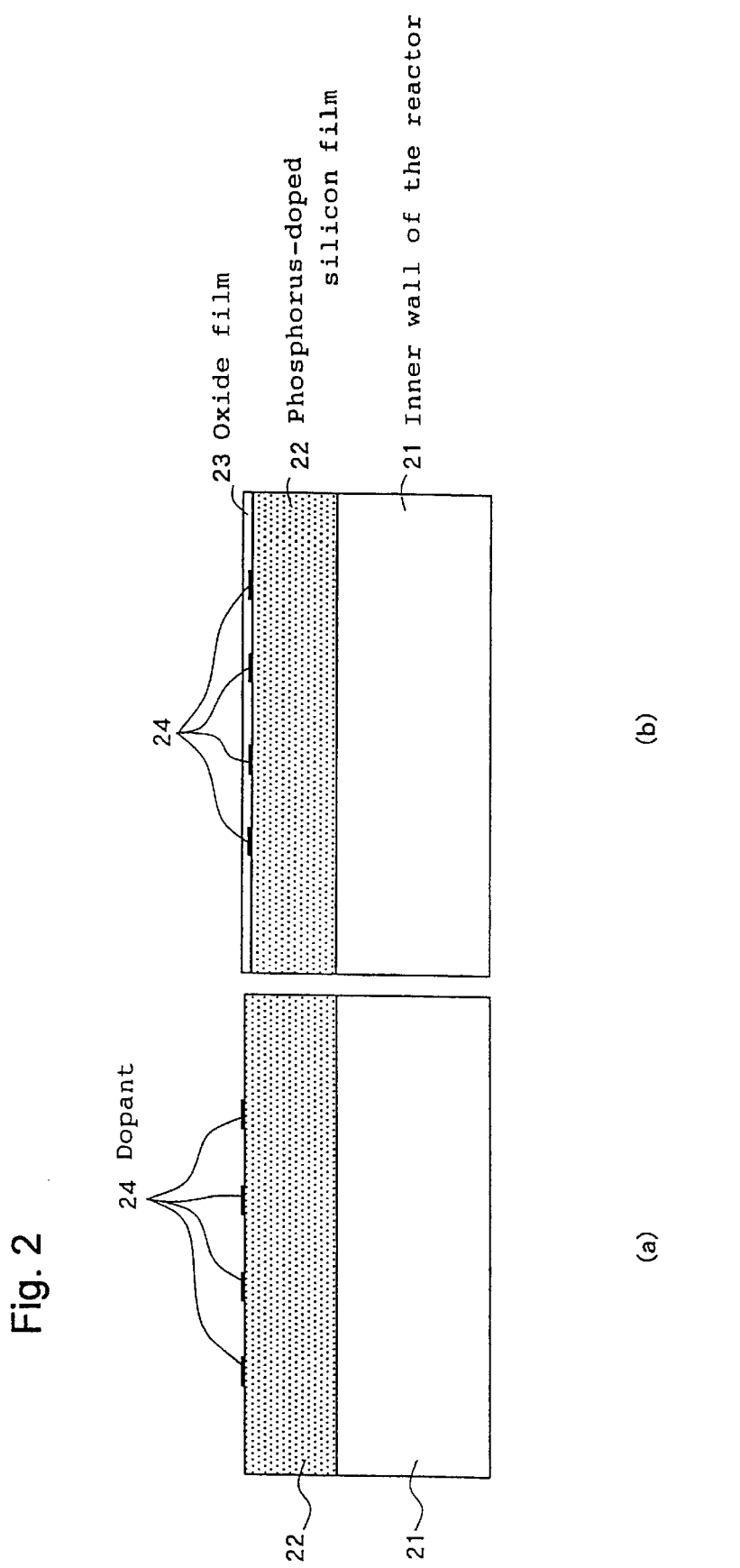
FIG. 2 is a schematic view of an inner wall of the reactor before and after forming an oxide film over a phosphorus-doped silicon film on the wall in a process of this invention.

FIG. 1 shows a schematic configuration of an embodiment of a CVD reactor according to this invention. The CVD reactor of this embodiment comprises an outer tube 1 and an inner tube 2 placed within the outer tube, as reaction tubes. The outer tube 1 is made of a material such as silicon carbide and quartz with a height of about 1000 to 1200 mm and an inner diameter of about 400 to 500 mm and has a pressure-resistant and heat-resisting structure. On its peripheral wall, there is provided a heater 3 which has a structure for allowing temperature setting for each of the wafer processing zones to be changed. The inner tube 2 which is also made of a material such as silicon carbide and quartz has outside dimensions sufficient to be accommodated in the outer tube 1. The outer tube 1 and the inner tube 2 are supported with a manifold 11, which are connected to an exhaust means via an outlet 6 to vacuum the reactor. The manifold 11 is also provided with quartz injectors (gas inlet tubes) 8, 9 and 10 for injecting gases into the inner tube. The inner tube is provided with a heat-reserving cylinder 4 for heating gases and a boat 5 on which wafers are to be placed. These components can be removed from the reactor together with a hatch 7.

The injectors connected to the inside of the inner tube 2 for injecting gases include the main injector 8 for a silane compound as well as the dopant injectors 9 and 10. The main injector 8 can simultaneously inject the silane compound as a main deposition gas and the dopant. The number of the dopant injectors is not limited as long as a dopant concentration can be kept even throughout the reactor during deposition, but generally 1 to 5. The dopant injectors 9 and 10 have their inlets in the central and the upper regions of the inner tube, respectively, to keep the dopant concentration even in the reactor regardless of consumption of the dopant during deposition. The number and the positions of the dopant injectors may be appropriately selected, depending on various elements such as the configuration of the reactor and an diameter of a wafer to be processed.

Silane compounds which may be used in this invention includes silane hydrides represented by $Si_nH_{2n+2}$ such as silane and disilane, halogenated silanes such as chlorosilane and any mixture thereof; preferably silane, disilane, chlorosilane and any combination thereof; most preferably silane, disilane and their mixture. A dopant is preferably a phosphorus compound such as $PH_3$. An oxidizing gas include oxygen, preferably oxygen diluted with an inert gas such as nitrogen, argon and helium.

An embodiment of a manufacturing process for a semiconductor device using the above CVD reactor will be described.

Outside the reactor a plurality of wafers are placed on the boat 5, which is then inserted into the inner tube whose inside is preheated to 500 to 600° C., preferably 500 to 550° C. The tube is vacuumed by a vacuum means. Next, an inert gas such as nitrogen is introduced into the reactor to maintain the inner pressure at 0.5 to 2.0 Torr, preferably 1.0 to 1.6 Torr, while heating the wafers inserted into the reactor.

Then, a silane compound and a dopant are injected from individual injectors. In the process of this embodiment, the main injector 8 injects $SiH_4$ at 1000 to 3000 sccm, preferably 1000 to 2000 sccm and $PH_3$ at 10 to 50 sccm, preferably 30 to 40 sccm; the dopant injector 9 injects $PH_3$ at below 5 sccm, preferably 1 to 3 sccm; and the dopant injector 10 injects $PH_3$ at 1 to 20 sccm. The flow rates of these deposition gases may be controlled by an external mass flow controller. An exhaust gas after the deposition reaction passes between the outer tube 1 and the inner tube 2 and is then discharged from the outlet 6 of the manifold 11. The gas flow is indicated by the arrows in FIG. 1.

Under the conditions, a phosphorus-doped silicon film 3000 Å of thickness is deposited on the wafers. Then the flow rate in the mass flow controller is set at zero to cease supplying all the deposition gases for termination of the deposition.

Then, the inside of the reactor and the injector lines are exhausted and the atmosphere is replaced with an inert gas such as nitrogen.

Keeping the above deposition temperature, 1% oxygen-containing argon gas is injected at a reduced pressure of 1 to 2 Torr at a flow rate of 1000 to 2000 sccm for 1 to 5 min from one or all of the injectors. Under the conditions, the surface of the phosphorus-doped film is oxidized to form an oxide film 5 to 15 Å of thickness. The deposition conditions such as the amount of oxygen, a pressure, a temperature and a duration are not limited, but it may be operationally preferable to select the temperature and the pressure regions as described for the previous deposition step.

Then, the reactor is opened in the atmosphere as usual, the processed wafers on the boat 5 are replaced with unprocessed ones, the boat 5 is again inserted into the inner tube 2 and a next batch of deposition is initiated as described above.

Figure 3:
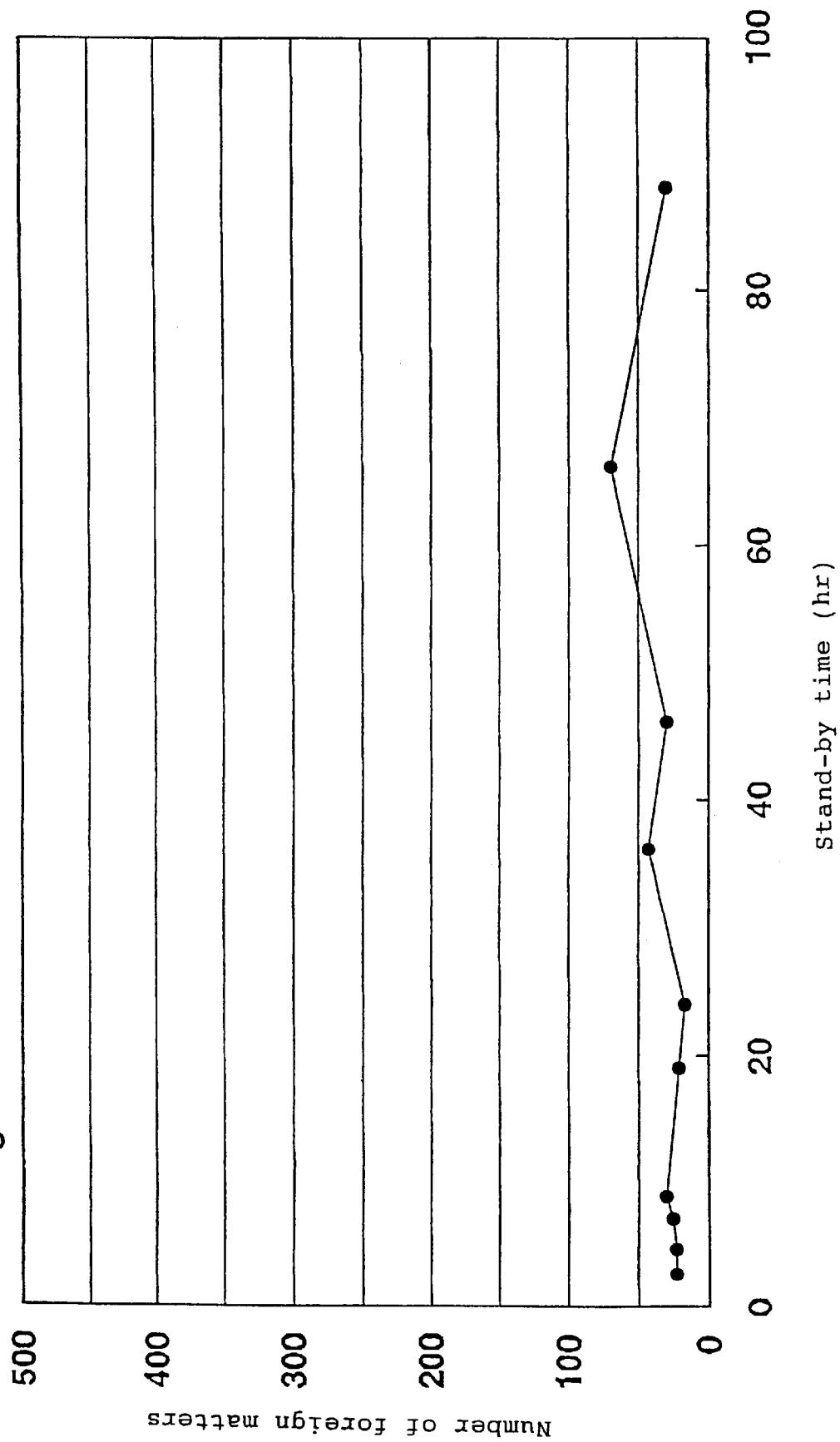
FIG. 3 shows the number of foreign matters in relation to a stand-by time for a phosphorus-doped silicon film deposited by a process of this invention.
Figure 4:
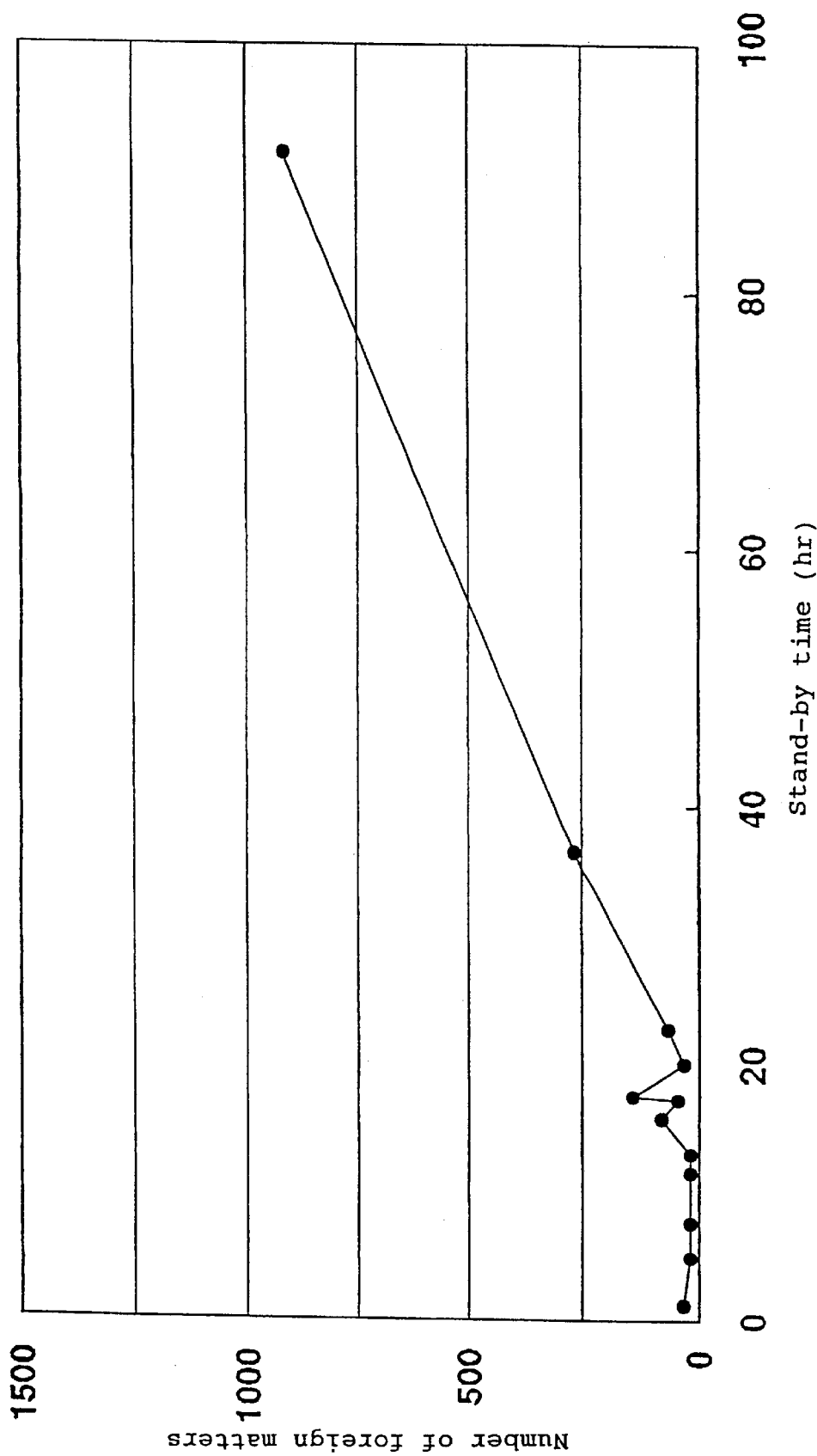
FIG. 4 shows the number of foreign matters in relation to a stand-by time for a phosphorus-doped silicon film deposited by a process of the prior art.
Figure 5:
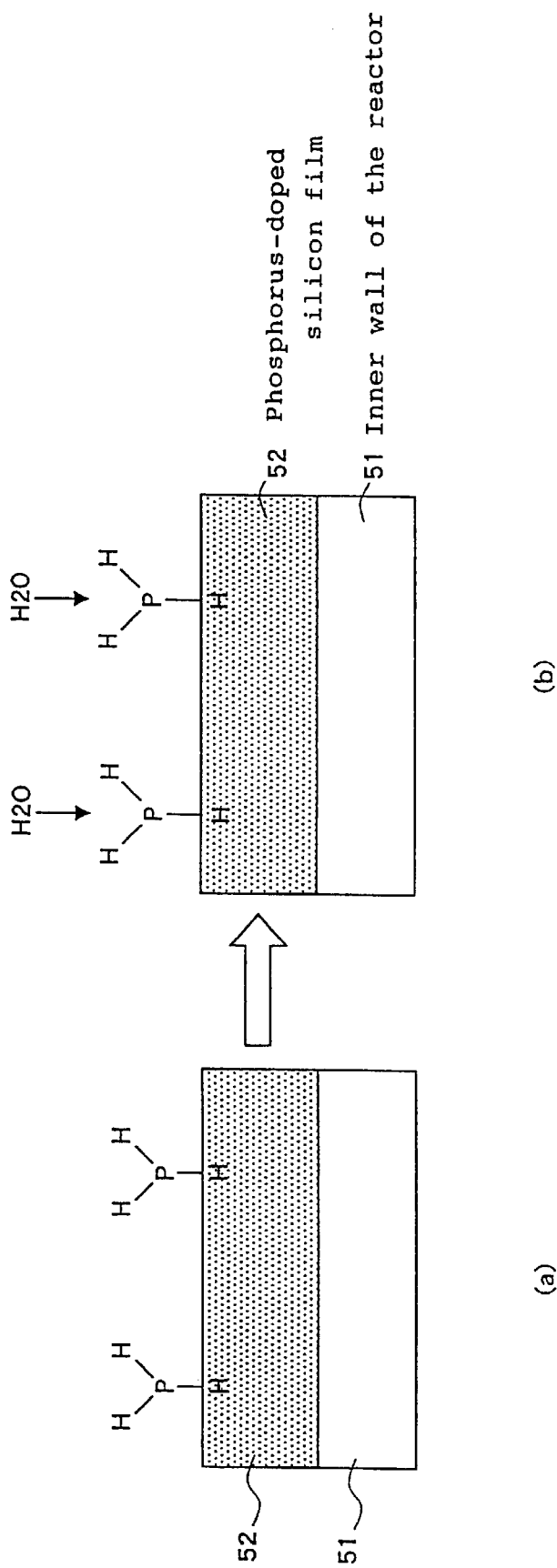
FIG. 5 schematically shows generation of a phosphorus compound on a phosphorus-doped silicon film on the inner wall of the reactor in a process of the prior art.
Figure 6:
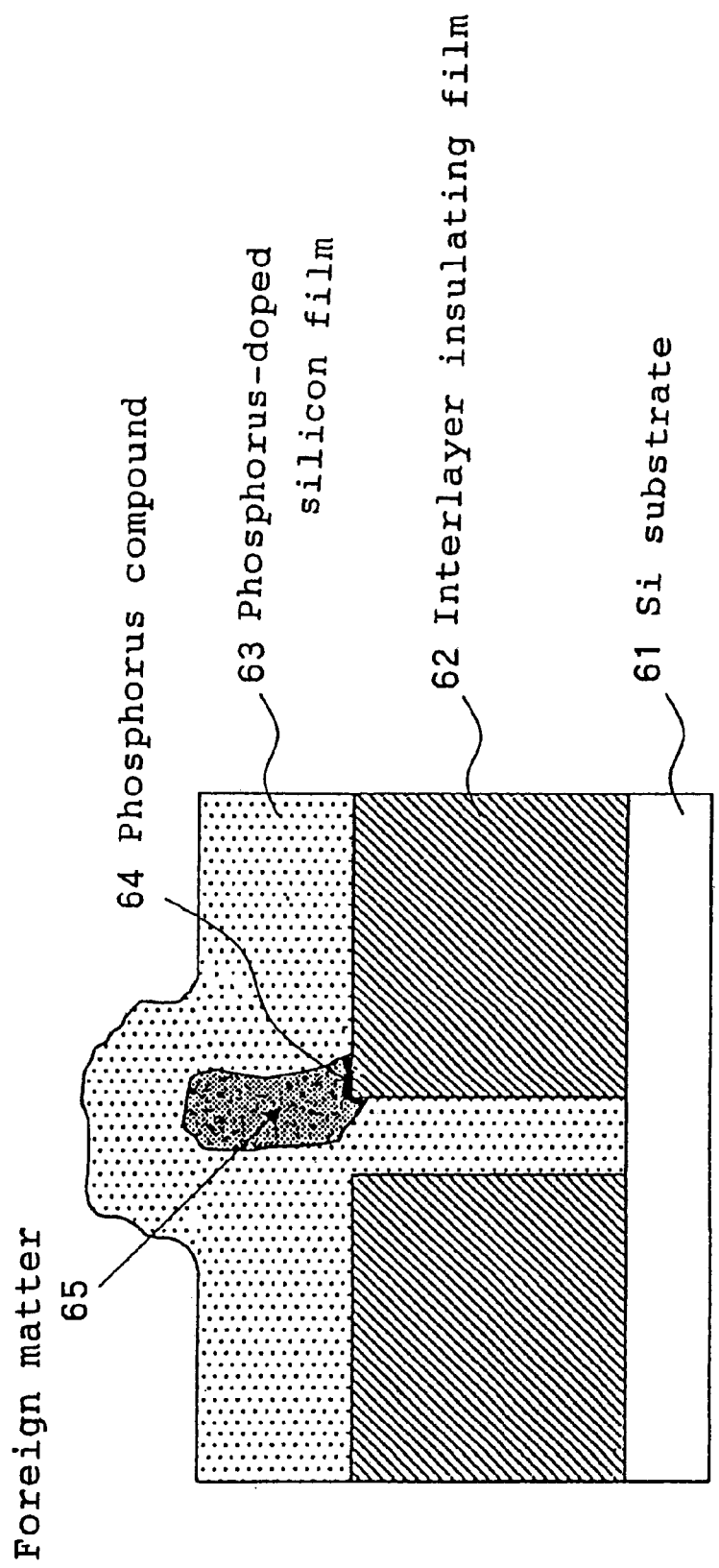
FIG. 6 schematically shows a phosphorus-doped silicon film on a wafer in which a foreign matter is generated in a process of the prior art.

As described above, a phosphorus-doped silicon film of the second batch was deposited with a different stand-by time from that in the first batch and the number of foreign matters generated in each phosphorus-doped silicon film was determined although foreign matters less than 0.3 μm of diameter and those in the regions within 4 mm from the wafer edge were not counted. FIG. 3 graphically shows the average number of foreign matters in relation to a stand-by time. For comparison, FIG. 4 shows the results of a process as described in this embodiment except that oxide film formation was omitted. The results indicate that this embodiment can minimize generation of foreign matters even with a longer stand-by time.

The phenomenon of foreign matter reduction when applying this embodiment may be explained by diffusion properties of phosphorus (diffusability) in a silicon or oxide film. The diffusion coefficient of phosphorus is relatively higher (3.85) in a silicon film (a higher diffusion rate), while that in an oxide film is considerably low, i.e., 5.73E-5 (1.68E-1 in some documents). For example, when oxidizing a silicon film or silicon substrate in which phosphorus is diffused, the diffused phosphorus is little incorporated into an oxide film and segregates in the interface between the silicon and the oxide films. This embodiment utilizes this property of phosphorus to enclose the dopant ($PH_3$) adhering to the deposited phosphorus-doped silicon film surface in an interface between the oxide and the phosphorus-doped silicon films.

According to the process of the above embodiment, a dopant (PH3) 24 adsorbed on a phosphorus-doped silicon film 22 deposited on a surface such as an inner wall 21 of a reactor may be covered by an oxide film before being exposed to the air. Thus, no sublimable phosphorous compounds are produced, and if produced, they are enclosed by an oxide film, by which one can avoid adhesion of phosphorus compounds to an unprocessed wafer surface during a next batch of deposition. An oxide film is formed over a phosphorus-doped silicon film of processed wafers, but it can be readily removed by a subsequent alkali washing or wet etching.

In the above embodiment, the oxide film was formed in the presence of the deposition-processed wafers in the reactor. Alternatively, the processed wafers are removed from the reactor, an oxide film is formed over a silicon film in the reactor and then unprocessed wafers are placed on the boat to initiate a next batch of deposition.

What is claimed is:

1. A manufacturing process for a semiconductor device, comprising:

injecting a silane compound and a dopant into a low-pressure chemical vapor deposition reactor to deposit a doped silicon film on a wafer;

at the end of the deposition, injecting an oxidizing gas to form an oxide film over the silicon film deposited in the reactor; and opening the reactor in the atmosphere to replace the wafer with a new one for a next batch of deposition after forming of the oxide film, wherein the low-pressure chemical vapor deposition reactor comprises a plurality of injectors for gases consisting of injectors not only for the silane compound but also for the dopant.

2. A manufacturing process for a semiconductor device as claimed in claim 1, wherein the oxidizing gas is injected under the temperature and the pressure during the deposition step.

3. A manufacturing process for a semiconductor device as claimed in claim 1, wherein at the end of the deposition step, the reactor and the injector lines are exhausted and replaced with an inert gas before the oxidizing gas is injected.

4. A manufacturing process for a semiconductor device as claimed in claim 1, wherein the dopant is a phosphorus compound.

5. A manufacturing process for a semiconductor device as claimed in claim 1, wherein the silane compound is selected from the group consisting of silane, disilane, chlorosilane and any combination thereof.

6. A manufacturing process for a semiconductor device as claimed in claim 1, wherein the oxidizing gas is selected from the group consisting of oxygen or oxygen diluted with an inert gas.

7. A manufacturing process for a semiconductor device as claimed in claim 1, wherein, during the step of injecting an oxidizing gas, the oxidizing gas is not injected into the low-pressure chemical vapor deposition reactor.

8. A manufacture process for a semiconductor device comprising:

injecting a silane compound and a dopant into a low-pressure chemical vapor deposition reactor to deposit a doped silicon film on a wafer; and injecting an oxidizing gas before placing a wafer to form an oxide film over the silicon film deposited in the reactor in the previous batch, wherein the low-pressure chemical vapor deposition reactor comprises a plurality of injectors for gases consisting of injectors not only for the silane compound but also for the dopant, wherein at the end of the deposition step, the reactor and the injector lines are exhausted and replace with an inert gas before the oxidizing gas in injected.

9. A manufacturing process for a semiconductor device as claimed in claim 8, wherein the dopant is a phosphorus compound.

10. A manufacturing process for a semiconductor device as claimed in claim 8, wherein the silane compound is selected from the group consisting of silane, disilane, chlorosilane and any combination thereof.

11. A manufacturing process for a semiconductor device as claimed in claim 8, wherein the oxidizing gas is selected from the group consisting of oxygen or oxygen diluted with an inert gas.

12. A manufacturing process for a semiconductor device as claimed in claim 8, wherein, during the step of injecting an oxidizing gas, the oxidizing gas is not injected into the low-pressure chemical vapor deposition reactor.

* * * * *